(12) United States Patent
Mayo

(10) Patent No.: US 9,899,834 B1
(45) Date of Patent: Feb. 20, 2018

(54) POWER CONTROL MODULE USING PROTECTION CIRCUIT FOR REGULATING BACKUP VOLTAGE TO POWER LOAD DURING POWER FAULT

(71) Applicant: Western Digital Technologies, Inc., Irvine, CA (US)

(72) Inventor: Ryan P. Mayo, Aliso Viejo, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 258 days.

(21) Appl. No.: 14/944,664

(22) Filed: Nov. 18, 2015

(51) Int. Cl.
H02J 1/06 (2006.01)
H02P 3/14 (2006.01)
G11C 5/14 (2006.01)
H02J 1/00 (2006.01)

(52) U.S. Cl.
CPC ............... *H02J 1/06* (2013.01); *G11C 5/141* (2013.01); *G11C 5/147* (2013.01); *H02P 3/14* (2013.01); *H02J 2001/008* (2013.01)

(58) Field of Classification Search
CPC combination set(s) only.
See application file for complete search history.

(56) References Cited

U.S. PATENT DOCUMENTS

| | | | |
|---|---|---|---|
| 6,014,283 A | 1/2000 | Codilian et al. | |
| 6,052,076 A | 4/2000 | Patton, III et al. | |
| 6,052,250 A | 4/2000 | Golowka et al. | |
| 6,067,206 A | 5/2000 | Hull et al. | |
| 6,078,453 A | 6/2000 | Dziallo et al. | |
| 6,091,564 A | 7/2000 | Codilian et al. | |
| 6,094,020 A | 7/2000 | Goretzki et al. | |
| 6,101,065 A | 8/2000 | Alfred et al. | |
| 6,104,153 A | 8/2000 | Codilian et al. | |
| 6,122,133 A | 9/2000 | Nazarian et al. | |
| 6,122,135 A | 9/2000 | Stich | |
| 6,141,175 A | 10/2000 | Nazarian et al. | |
| 6,160,368 A | 12/2000 | Plutowski | |
| 6,181,502 B1 | 1/2001 | Hussein et al. | |
| 6,195,222 B1 | 2/2001 | Heminger et al. | |
| 6,198,584 B1 | 3/2001 | Codilian et al. | |
| 6,198,590 B1 | 3/2001 | Codilian et al. | |

(Continued)

OTHER PUBLICATIONS

Timothy A. Ferris, et al., U.S. Appl. No. 14/146,555, filed Jan. 2, 2014, 33 pages.

*Primary Examiner* — An Luu
(74) *Attorney, Agent, or Firm* — Foley & Lardner LLP

(57) ABSTRACT

A power control module comprising low voltage (LV) port for receiving low supply voltage via LV supply line, high voltage (HV) input port for receiving high supply voltage via HV supply line, wherein high supply voltage is higher than low supply voltage, LV output port for providing low output voltage, HV output port for providing high output voltage, LV node coupled to LV input port, HV node coupled to HV input port, bypass circuit coupled between LV and HV nodes, LV protection circuit coupled between LV node and LV output port, and control circuitry configured to detect power fault on either LV or HV supply line, isolate the LV and HV nodes from LV and HV supply lines, provide backup voltage to LV node, and cause LV protection circuit to regulate backup voltage at LV node to maintain low output voltage at LV output port to within predetermined operating range.

37 Claims, 6 Drawing Sheets

(56) References Cited

U.S. PATENT DOCUMENTS

| | | |
|---|---|---|
| 6,204,988 B1 | 3/2001 | Codilian et al. |
| 6,243,223 B1 | 6/2001 | Elliott et al. |
| 6,281,652 B1 | 8/2001 | Ryan et al. |
| 6,285,521 B1 | 9/2001 | Hussein |
| 6,292,320 B1 | 9/2001 | Mason et al. |
| 6,310,742 B1 | 10/2001 | Nazarian et al. |
| 6,320,718 B1 | 11/2001 | Bouwkamp et al. |
| 6,342,984 B1 | 1/2002 | Hussein et al. |
| 6,347,018 B1 | 2/2002 | Kadlec et al. |
| 6,369,972 B1 | 4/2002 | Codilian et al. |
| 6,369,974 B1 | 4/2002 | Asgari et al. |
| 6,462,896 B1 | 10/2002 | Codilian et al. |
| 6,476,996 B1 | 11/2002 | Ryan |
| 6,484,577 B1 | 11/2002 | Bennett |
| 6,493,169 B1 | 12/2002 | Ferris et al. |
| 6,496,324 B1 | 12/2002 | Golowka et al. |
| 6,498,698 B1 | 12/2002 | Golowka et al. |
| 6,507,450 B1 | 1/2003 | Elliott |
| 6,534,936 B2 | 3/2003 | Messenger et al. |
| 6,538,839 B1 | 3/2003 | Ryan |
| 6,545,835 B1 | 4/2003 | Codilian |
| 6,549,359 B1 | 4/2003 | Bennett et al. |
| 6,549,361 B1 | 4/2003 | Bennett et al. |
| 6,560,056 B1 | 5/2003 | Ryan |
| 6,568,268 B1 | 5/2003 | Bennett |
| 6,574,062 B1 | 6/2003 | Bennett et al. |
| 6,577,465 B1 | 6/2003 | Bennett et al. |
| 6,614,615 B1 | 9/2003 | Ju et al. |
| 6,614,618 B1 | 9/2003 | Sheh et al. |
| 6,636,377 B1 | 10/2003 | Yu et al. |
| 6,690,536 B1 | 2/2004 | Ryan |
| 6,693,764 B1 | 2/2004 | Sheh et al. |
| 6,707,635 B1 | 3/2004 | Codilian et al. |
| 6,710,953 B1 | 3/2004 | Vallis et al. |
| 6,710,966 B1 | 3/2004 | Codilian et al. |
| 6,714,371 B1 | 3/2004 | Codilian |
| 6,714,372 B1 | 3/2004 | Codilian et al. |
| 6,724,564 B1 | 4/2004 | Codilian et al. |
| 6,731,450 B1 | 5/2004 | Codilian et al. |
| 6,735,041 B1 | 5/2004 | Codilian et al. |
| 6,738,220 B1 | 5/2004 | Codilian |
| 6,747,837 B1 | 6/2004 | Bennett |
| 6,760,186 B1 | 7/2004 | Codilian et al. |
| 6,788,483 B1 | 9/2004 | Ferris et al. |
| 6,791,785 B1 | 9/2004 | Messenger et al. |
| 6,795,268 B1 | 9/2004 | Ryan |
| 6,819,518 B1 | 11/2004 | Melkote et al. |
| 6,826,006 B1 | 11/2004 | Melkote et al. |
| 6,826,007 B1 | 11/2004 | Patton, III |
| 6,847,502 B1 | 1/2005 | Codilian |
| 6,850,383 B1 | 2/2005 | Bennett |
| 6,850,384 B1 | 2/2005 | Bennett |
| 6,867,944 B1 | 3/2005 | Ryan |
| 6,876,508 B1 | 4/2005 | Patton, III et al. |
| 6,882,496 B1 | 4/2005 | Codilian et al. |
| 6,885,514 B1 | 4/2005 | Codilian et al. |
| 6,900,958 B1 | 5/2005 | Yi et al. |
| 6,900,959 B1 | 5/2005 | Gardner et al. |
| 6,903,897 B1 | 6/2005 | Wang et al. |
| 6,914,740 B1 | 7/2005 | Tu et al. |
| 6,914,743 B1 | 7/2005 | Narayana et al. |
| 6,920,004 B1 | 7/2005 | Codilian et al. |
| 6,924,959 B1 | 8/2005 | Melkote et al. |
| 6,924,960 B1 | 8/2005 | Melkote et al. |
| 6,924,961 B1 | 8/2005 | Melkote et al. |
| 6,934,114 B1 | 8/2005 | Codilian et al. |
| 6,934,135 B1 | 8/2005 | Ryan |
| 6,937,420 B1 | 8/2005 | McNab et al. |
| 6,937,423 B1 | 8/2005 | Ngo et al. |
| 6,952,322 B1 | 10/2005 | Codilian et al. |
| 6,954,324 B1 | 10/2005 | Tu et al. |
| 6,958,881 B1 | 10/2005 | Codilian et al. |
| 6,963,465 B1 | 11/2005 | Melkote et al. |
| 6,965,488 B1 | 11/2005 | Bennett |
| 6,967,458 B1 | 11/2005 | Bennett et al. |
| 6,967,811 B1 | 11/2005 | Codilian et al. |
| 6,970,319 B1 | 11/2005 | Bennett et al. |
| 6,972,539 B1 | 12/2005 | Codilian et al. |
| 6,972,540 B1 | 12/2005 | Wang et al. |
| 6,972,922 B1 | 12/2005 | Subrahmanyam et al. |
| 6,975,480 B1 | 12/2005 | Codilian et al. |
| 6,977,789 B1 | 12/2005 | Cloke |
| 6,980,389 B1 | 12/2005 | Kupferman |
| 6,987,636 B1 | 1/2006 | Chue et al. |
| 6,987,639 B1 | 1/2006 | Yu |
| 6,989,954 B1 | 1/2006 | Lee et al. |
| 6,992,848 B1 | 1/2006 | Agarwal et al. |
| 6,992,851 B1 | 1/2006 | Cloke |
| 6,992,852 B1 | 1/2006 | Ying et al. |
| 6,995,941 B1 | 2/2006 | Miyamura et al. |
| 6,999,263 B1 | 2/2006 | Melkote et al. |
| 6,999,267 B1 | 2/2006 | Melkote et al. |
| 7,006,320 B1 | 2/2006 | Bennett et al. |
| 7,016,134 B1 | 3/2006 | Agarwal et al. |
| 7,023,637 B1 | 4/2006 | Kupferman |
| 7,023,640 B1 | 4/2006 | Codilian et al. |
| 7,027,256 B1 | 4/2006 | Subrahmanyam et al. |
| 7,027,257 B1 | 4/2006 | Kupferman |
| 7,035,026 B2 | 4/2006 | Codilian et al. |
| 7,046,472 B1 | 5/2006 | Melkote et al. |
| 7,050,249 B1 | 5/2006 | Chue et al. |
| 7,050,254 B1 | 5/2006 | Yu et al. |
| 7,050,258 B1 | 5/2006 | Codilian |
| 7,054,098 B1 | 5/2006 | Yu et al. |
| 7,061,714 B1 | 6/2006 | Yu |
| 7,064,918 B1 | 6/2006 | Codilian et al. |
| 7,068,451 B1 | 6/2006 | Wang et al. |
| 7,068,459 B1 | 6/2006 | Cloke et al. |
| 7,068,461 B1 | 6/2006 | Chue et al. |
| 7,068,463 B1 | 6/2006 | Ji et al. |
| 7,088,547 B1 | 8/2006 | Wang et al. |
| 7,095,579 B1 | 8/2006 | Ryan et al. |
| 7,110,208 B1 | 9/2006 | Miyamura et al. |
| 7,110,214 B1 | 9/2006 | Tu et al. |
| 7,113,362 B1 | 9/2006 | Lee et al. |
| 7,113,365 B1 | 9/2006 | Ryan et al. |
| 7,116,505 B1 | 10/2006 | Kupferman |
| 7,126,781 B1 | 10/2006 | Bennett |
| 7,158,329 B1 | 1/2007 | Ryan |
| 7,180,703 B1 | 2/2007 | Subrahmanyam et al. |
| 7,184,230 B1 | 2/2007 | Chue et al. |
| 7,196,864 B1 | 3/2007 | Yi et al. |
| 7,199,966 B1 | 4/2007 | Tu et al. |
| 7,203,021 B1 | 4/2007 | Ryan et al. |
| 7,209,321 B1 | 4/2007 | Bennett |
| 7,212,364 B1 | 5/2007 | Lee |
| 7,212,374 B1 | 5/2007 | Wang et al. |
| 7,215,504 B1 | 5/2007 | Bennett |
| 7,224,546 B1 | 5/2007 | Orakcilar et al. |
| 7,248,426 B1 | 7/2007 | Weerasooriya et al. |
| 7,251,098 B1 | 7/2007 | Wang et al. |
| 7,253,582 B1 | 8/2007 | Ding et al. |
| 7,253,989 B1 | 8/2007 | Lau et al. |
| 7,265,933 B1 | 9/2007 | Phan et al. |
| 7,289,288 B1 | 10/2007 | Tu |
| 7,298,574 B1 | 11/2007 | Melkote et al. |
| 7,301,717 B1 | 11/2007 | Lee et al. |
| 7,304,819 B1 | 12/2007 | Melkote et al. |
| 7,330,019 B1 | 2/2008 | Bennett |
| 7,330,327 B1 | 2/2008 | Chue et al. |
| 7,333,280 B1 | 2/2008 | Lifchits et al. |
| 7,333,290 B1 | 2/2008 | Kupferman |
| 7,339,761 B1 | 3/2008 | Tu et al. |
| 7,365,932 B1 | 4/2008 | Bennett |
| 7,388,728 B1 | 6/2008 | Chen et al. |
| 7,391,583 B1 | 6/2008 | Sheh et al. |
| 7,391,584 B1 | 6/2008 | Sheh et al. |
| 7,433,143 B1 | 10/2008 | Ying et al. |
| 7,440,210 B1 | 10/2008 | Lee |
| 7,440,225 B1 | 10/2008 | Chen et al. |
| 7,450,334 B1 | 11/2008 | Wang et al. |
| 7,450,336 B1 | 11/2008 | Wang et al. |
| 7,453,661 B1 | 11/2008 | Jang et al. |
| 7,457,071 B1 | 11/2008 | Sheh |

(56) References Cited

U.S. PATENT DOCUMENTS

| | | |
|---|---|---|
| 7,466,509 B1 | 12/2008 | Chen et al. |
| 7,468,855 B1 | 12/2008 | Weerasooriya et al. |
| 7,477,471 B1 | 1/2009 | Nemshick et al. |
| 7,480,116 B1 | 1/2009 | Bennett |
| 7,489,464 B1 | 2/2009 | McNab et al. |
| 7,492,546 B1 | 2/2009 | Miyamura |
| 7,495,857 B1 | 2/2009 | Bennett |
| 7,499,236 B1 | 3/2009 | Lee et al. |
| 7,502,192 B1 | 3/2009 | Wang et al. |
| 7,502,195 B1 | 3/2009 | Wu et al. |
| 7,502,197 B1 | 3/2009 | Chue |
| 7,505,223 B1 | 3/2009 | McCornack |
| 7,542,225 B1 | 6/2009 | Ding et al. |
| 7,548,392 B1 | 6/2009 | Desai et al. |
| 7,551,390 B1 | 6/2009 | Wang et al. |
| 7,558,016 B1 | 7/2009 | Le et al. |
| 7,573,670 B1 | 8/2009 | Ryan et al. |
| 7,576,941 B1 | 8/2009 | Chen et al. |
| 7,580,212 B1 | 8/2009 | Li et al. |
| 7,583,470 B1 | 9/2009 | Chen et al. |
| 7,595,954 B1 | 9/2009 | Chen et al. |
| 7,602,575 B1 | 10/2009 | Lifchits et al. |
| 7,616,399 B1 | 11/2009 | Chen et al. |
| 7,619,844 B1 | 11/2009 | Bennett |
| 7,626,782 B1 | 12/2009 | Yu et al. |
| 7,630,162 B2 | 12/2009 | Zhao et al. |
| 7,639,447 B1 | 12/2009 | Yu et al. |
| 7,656,604 B1 | 2/2010 | Liang et al. |
| 7,656,607 B1 | 2/2010 | Bennett |
| 7,660,067 B1 | 2/2010 | Ji et al. |
| 7,663,835 B1 | 2/2010 | Yu et al. |
| 7,675,707 B1 | 3/2010 | Liu et al. |
| 7,679,854 B1 | 3/2010 | Narayana et al. |
| 7,688,534 B1 | 3/2010 | McCornack |
| 7,688,538 B1 | 3/2010 | Chen et al. |
| 7,688,539 B1 | 3/2010 | Bryant et al. |
| 7,697,233 B1 | 4/2010 | Bennett et al. |
| 7,701,661 B1 | 4/2010 | Bennett |
| 7,710,676 B1 | 5/2010 | Chue |
| 7,715,138 B1 | 5/2010 | Kupferman |
| 7,729,079 B1 | 6/2010 | Huber |
| 7,733,189 B1 | 6/2010 | Bennett |
| 7,746,592 B1 | 6/2010 | Liang et al. |
| 7,746,594 B1 | 6/2010 | Guo et al. |
| 7,746,595 B1 | 6/2010 | Guo et al. |
| 7,760,461 B1 | 7/2010 | Bennett |
| 7,800,853 B1 | 9/2010 | Guo et al. |
| 7,800,856 B1 | 9/2010 | Bennett et al. |
| 7,800,857 B1 | 9/2010 | Calaway et al. |
| 7,839,591 B1 | 11/2010 | Weerasooriya et al. |
| 7,839,595 B1 | 11/2010 | Chue et al. |
| 7,839,600 B1 | 11/2010 | Babinski et al. |
| 7,843,662 B1 | 11/2010 | Weerasooriya et al. |
| 7,852,588 B1 | 12/2010 | Ferris et al. |
| 7,852,592 B1 | 12/2010 | Liang et al. |
| 7,863,845 B2 * | 1/2011 | Kasai .................... B62D 5/046 318/139 |
| 7,864,481 B1 | 1/2011 | Kon et al. |
| 7,864,482 B1 | 1/2011 | Babinski et al. |
| 7,869,155 B1 | 1/2011 | Wong |
| 7,876,522 B1 | 1/2011 | Calaway et al. |
| 7,876,523 B1 | 1/2011 | Panyavoravaj et al. |
| 7,916,415 B1 | 3/2011 | Chue |
| 7,916,416 B1 | 3/2011 | Guo et al. |
| 7,916,420 B1 | 3/2011 | McFadyen et al. |
| 7,916,422 B1 | 3/2011 | Guo et al. |
| 7,929,238 B1 | 4/2011 | Vasquez |
| 7,961,422 B1 | 6/2011 | Chen et al. |
| 8,000,053 B1 | 8/2011 | Anderson |
| 8,031,423 B1 | 10/2011 | Tsai et al. |
| 8,054,022 B1 | 11/2011 | Ryan et al. |
| 8,059,357 B1 | 11/2011 | Knigge et al. |
| 8,059,360 B1 | 11/2011 | Melkote et al. |
| 8,072,703 B1 | 12/2011 | Calaway et al. |
| 8,077,428 B1 | 12/2011 | Chen et al. |
| 8,078,901 B1 | 12/2011 | Meyer et al. |
| 8,081,395 B1 | 12/2011 | Ferris |
| 8,085,020 B1 | 12/2011 | Bennett |
| 8,116,023 B1 | 2/2012 | Kupferman |
| 8,145,934 B1 | 3/2012 | Ferris et al. |
| 8,179,626 B1 | 5/2012 | Ryan et al. |
| 8,189,286 B1 | 5/2012 | Chen et al. |
| 8,213,106 B1 | 7/2012 | Guo et al. |
| 8,254,222 B1 | 8/2012 | Tang |
| 8,300,348 B1 | 10/2012 | Liu et al. |
| 8,315,005 B1 | 11/2012 | Zou et al. |
| 8,320,069 B1 | 11/2012 | Knigge et al. |
| 8,351,174 B1 | 1/2013 | Gardner et al. |
| 8,358,114 B1 | 1/2013 | Ferris et al. |
| 8,358,145 B1 | 1/2013 | Ferris et al. |
| 8,390,367 B1 | 3/2013 | Bennett |
| 8,432,031 B1 | 4/2013 | Agness et al. |
| 8,432,629 B1 | 4/2013 | Rigney et al. |
| 8,451,697 B1 | 5/2013 | Rigney et al. |
| 8,482,873 B1 | 7/2013 | Chue et al. |
| 8,498,076 B1 | 7/2013 | Sheh et al. |
| 8,498,172 B1 | 7/2013 | Patton, III et al. |
| 8,508,881 B1 | 8/2013 | Babinski et al. |
| 8,531,798 B1 | 9/2013 | Xi et al. |
| 8,537,486 B2 | 9/2013 | Liang et al. |
| 8,542,455 B2 | 9/2013 | Huang et al. |
| 8,553,351 B1 | 10/2013 | Narayana et al. |
| 8,564,899 B2 | 10/2013 | Lou et al. |
| 8,576,506 B1 | 11/2013 | Wang et al. |
| 8,605,382 B1 | 12/2013 | Mallary et al. |
| 8,605,384 B1 | 12/2013 | Liu et al. |
| 8,610,391 B1 | 12/2013 | Yang et al. |
| 8,611,040 B1 | 12/2013 | Xi et al. |
| 8,619,385 B1 | 12/2013 | Guo et al. |
| 8,630,054 B2 | 1/2014 | Bennett et al. |
| 8,630,059 B1 | 1/2014 | Chen et al. |
| 8,634,154 B1 | 1/2014 | Rigney et al. |
| 8,634,283 B1 | 1/2014 | Rigney et al. |
| 8,643,976 B1 | 2/2014 | Wang et al. |
| 8,649,121 B1 | 2/2014 | Smith et al. |
| 8,654,466 B1 | 2/2014 | McFadyen |
| 8,654,467 B1 | 2/2014 | Wong et al. |
| 8,665,546 B1 | 3/2014 | Zhao et al. |
| 8,665,551 B1 | 3/2014 | Rigney et al. |
| 8,670,206 B1 | 3/2014 | Liang et al. |
| 8,687,312 B1 | 4/2014 | Liang |
| 8,693,123 B1 | 4/2014 | Guo et al. |
| 8,693,134 B1 | 4/2014 | Xi et al. |
| 8,699,173 B1 | 4/2014 | Kang et al. |
| 8,710,820 B2 | 4/2014 | Parker |
| 8,711,027 B1 | 4/2014 | Bennett |
| 8,717,696 B1 | 5/2014 | Ryan et al. |
| 8,717,699 B1 | 5/2014 | Ferris |
| 8,717,704 B1 | 5/2014 | Yu et al. |
| 8,724,245 B1 | 5/2014 | Smith et al. |
| 8,724,253 B1 | 5/2014 | Liang et al. |
| 8,724,524 B2 | 5/2014 | Urabe et al. |
| 8,737,008 B1 | 5/2014 | Watanabe et al. |
| 8,737,013 B2 | 5/2014 | Zhou et al. |
| 8,743,495 B1 | 6/2014 | Chen et al. |
| 8,743,503 B1 | 6/2014 | Tang et al. |
| 8,743,504 B1 | 6/2014 | Bryant et al. |
| 8,749,904 B1 | 6/2014 | Liang et al. |
| 8,760,796 B1 | 6/2014 | Lou et al. |
| 8,767,332 B1 | 7/2014 | Chahwan et al. |
| 8,767,343 B1 | 7/2014 | Helmick et al. |
| 8,767,354 B1 | 7/2014 | Ferris |
| 8,773,787 B1 | 7/2014 | Beker |
| 8,779,574 B1 | 7/2014 | Agness et al. |
| 8,780,473 B1 | 7/2014 | Zhao et al. |
| 8,780,477 B1 | 7/2014 | Guo et al. |
| 8,780,479 B1 | 7/2014 | Helmick et al. |
| 8,780,489 B1 | 7/2014 | Gayaka et al. |
| 8,792,202 B1 | 7/2014 | Wan et al. |
| 8,797,664 B1 | 8/2014 | Guo et al. |
| 8,804,267 B2 | 8/2014 | Huang et al. |
| 8,824,081 B1 | 9/2014 | Guo et al. |
| 8,824,262 B1 | 9/2014 | Liu et al. |
| 8,868,938 B2 | 10/2014 | Luo et al. |

(56) References Cited

U.S. PATENT DOCUMENTS

| | | |
|---|---|---|
| 2010/0035085 A1 | 2/2010 | Jung et al. |
| 2012/0284493 A1 | 11/2012 | Lou et al. |
| 2013/0120870 A1 | 5/2013 | Zhou et al. |
| 2013/0148240 A1 | 6/2013 | Ferris et al. |
| 2016/0211700 A1* | 7/2016 | Zhang ...................... H02J 9/06 |

\* cited by examiner

POWER CONTROL MODULE OPERATING MODES FOR EMBODIMENT IN FIG. 1A

| POWER CONTROL MODULE OP. MODE | LV ISOLATION CIRCUIT STATE | HV ISOLATION CIRCUIT STATE | BYPASS CIRCUIT STATE | LV PROTECTION CIRCUIT STATE | HV PROTECTION CIRCUIT STATE |
|---|---|---|---|---|---|
| POWER GOOD | ON | ON | OFF | ON | ON |
| POWER FAULT DETECTION (HOLD-UP) | OFF | OFF | ON | OHMIC | ON |
| UV LOCKOUT | OFF | OFF | OFF | OFF | OFF |
| POWER ON RAMP | ON | ON | OFF | OHMIC | OHMIC |

FIG. 1B

POWER CONTROL MODULE OPERATING MODES FOR EMBODIMENT IN FIG. 2A

| POWER CONTROL MODULE OP. MODE | LV ISOLATION CIRCUIT STATE | HV ISOLATION CIRCUIT STATE | BYPASS CIRCUIT STATE | LV PROTECTION CIRCUIT STATE |
|---|---|---|---|---|
| POWER GOOD | ON | ON-A | OFF-B | ON-A |
| POWER FAULT DETECTION (HOLD-UP) | OFF | OFF-A | ON-A | OHMIC-B |
| UV LOCKOUT | OFF | OFF-A | OFF-A | OFF-B |
| POWER ON RAMP (STAGE 1) | ON | OHMIC-B | OFF-A | OHMIC-B |
| POWER ON RAMP (STAGE 2) | ON | OHMIC-B | OFF-B | OHMIC-B |

FIG. 2B

POWER CONTROL MODULE USING PROTECTION CIRCUIT FOR REGULATING BACKUP VOLTAGE TO POWER LOAD DURING POWER FAULT

BACKGROUND

Backup power is commonly provided to a load (e.g., components of a data storage device, such as a hard disk drive (HDD), solid state hybrid drive (SSHD), or solid state drive (SSD)) in case power from a host power supply is interrupted to the load. For example, backup power may be provided by a backup power source including one or more charge storage elements (e.g., capacitors or batteries) that are charged to a required backup voltage. For example, if the load includes components of a disk drive or a hybrid drive, backup power may be provided by energy generated from the windings of a spindle motor.

Backup power is generally provided to a load that includes components of an HDD, SSHD, or SSHD to ensure that user data is fully protected when an interruption of power from a host power supply to the load is detected. For example, in an HDD comprising a controller for controlling data operations to a disk (i.e., reading data from or writing data to the disk), when an interruption of power from the host power supply is detected, backup power generated from the windings of a spindle motor may be used to enable the controller to finish any on-going writing of data to a sector on the disk, thereby preventing loss of user data.

BRIEF DESCRIPTION OF THE DRAWINGS

Power control modules and methods that embody the various features of the invention will now be described with reference to the following drawings, in which:

FIG. 1B is a table showing various operating modes of the power control module shown in FIG. 1A, in accordance with one embodiment of the invention.

FIG. 2B is a table showing various operating modes of the power control module shown in FIG. 2A, in accordance with one embodiment of the invention.

DETAILED DESCRIPTION

Various embodiments of the invention are directed to providing a power control module comprising control circuitry configured to detect a power fault (e.g., an undervoltage condition) on a low or high voltage supply line from an external power supply, isolate the low and high supply lines from the power control module, provide a backup voltage to an high voltage (HV) node, provide the backup voltage to a low voltage (LV) node via a bypass circuit coupled between the HV and LV nodes, and cause an LV protection circuit coupled between the LV node and an LV output (LVOUT) port to regulate the backup voltage at the LV node to maintain a low output voltage at the LVOUT port to within a predetermined operating range. For example, the predetermined operating range may be an operating range as specified for proper operation of an LV load coupled to the LVOUT port.

In various embodiments of the invention, the control circuitry is configured to cause the LV protection circuit to operate in an ohmic state to linearly regulate the backup voltage at the LV node and provide backup power to an LV load coupled to the LVOUT port when the power fault is detected. In one embodiment, the LV load comprises one or more low voltage components of a data storage device in which the power control module resides. In various embodiments, the power control module further comprises an HVOUT port coupled to an HV load. In one embodiment, the HV load comprises one or more components of a data storage device in which the power control module resides.

In various embodiments of the invention, the power control module further comprises LV and HV isolations circuits that are used to isolate the respective LV and HV nodes from the external power supply LV and HV supply lines when the power fault is detected. In one embodiment, the bypass circuit and the LV protection circuit provide switched back-gate biasing to provide switchable reverse or forward (inrush) current protection. In one embodiment, a backup power source coupled to multiple I/O ports of the power control module comprises a spindle motor that provides backup energy to the power control module when the power fault is detected.

Various embodiments of the invention will now be described. These embodiments are presented by way of example only, and are not intended to limit the scope of the invention. Various omissions, substitutions and changes in the form of the methods and devices described herein may be made without departing from the spirit of the invention. To illustrate some of the embodiments, reference will now be made to the figures.

Figure 1A:
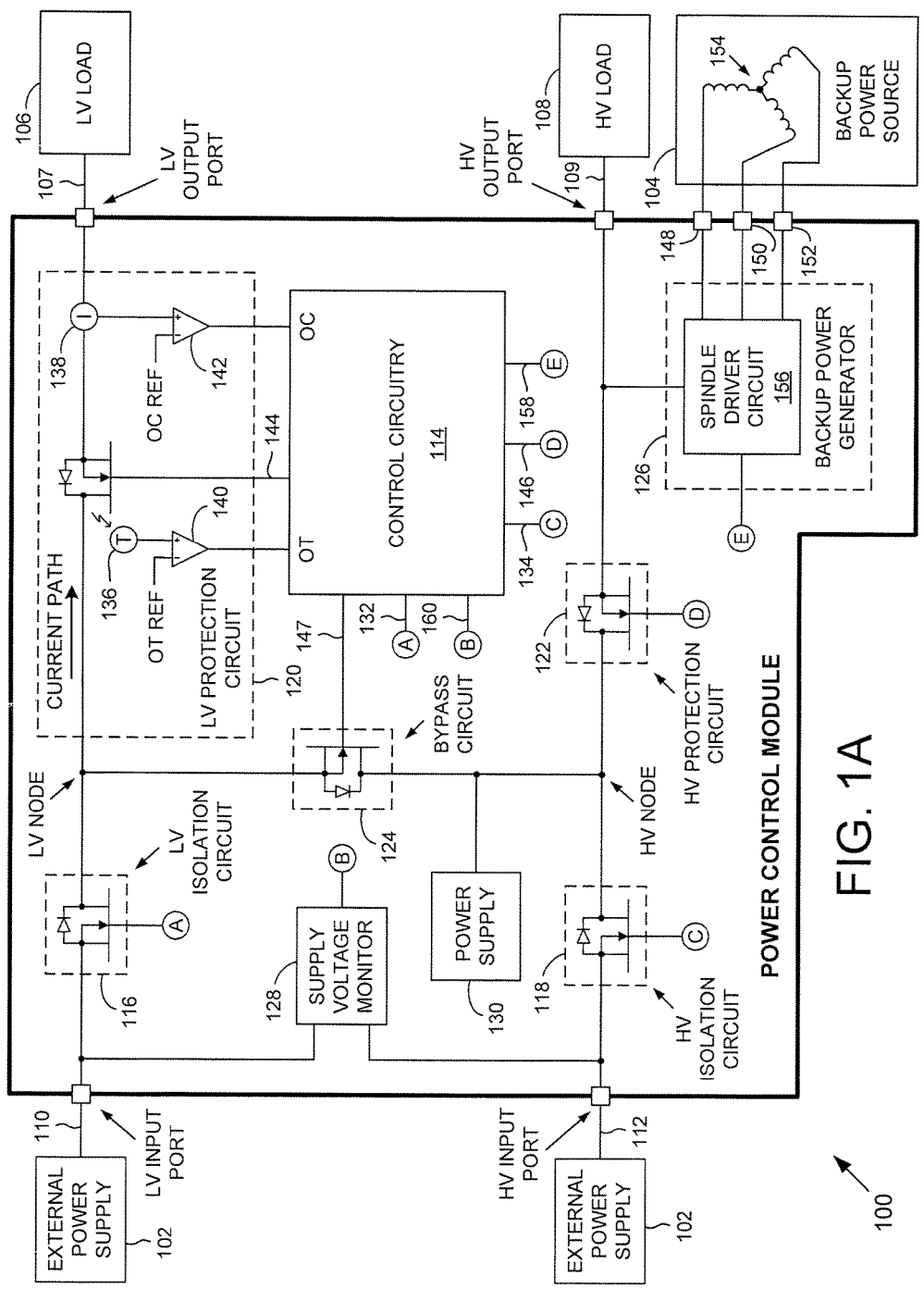
FIG. 1A is a block diagram showing a power control module coupled to an external power supply, a backup power source, and low voltage (LV) and high voltage (HV) loads, wherein, when a power fault is detected on either an LV or an HV line from the external power supply, a backup voltage from the backup power source is coupled, via a bypass circuit, to an LV protection circuit to provide power to the LV load, in accordance with one embodiment of the invention.

FIG. 1A shows a power control module 100 coupled to an external power supply 102, a backup power source 104, an LV load 106, and an HV load 108, in accordance with one embodiment of the invention. As shown in FIG. 1A, the power control module 100 comprises an LVIN port for receiving a low supply voltage from the external power supply 102 (which may be, in one embodiment, a host power supply residing in a computing device such as a desktop, laptop or tablet computer or be a standalone power supply) via LV supply line 110, and an LVOUT port for providing power to the LV load 106 via an LV output power rail 107. In one embodiment, the LV load 106 may comprise one or more LV components of a data storage device (e.g., an HDD, SSHD, or SSD). For example, the LV components of the data store device may include a preamp and a regulator bank, which may provide power to a System On a Chip (SOC) (which can comprise a controller), volatile memory, an I/O interface, and non-volatile semiconductor memory, for example.

Also shown in FIG. 1A, the power control module 100 further comprises an HVIN port for receiving a high supply voltage from the external power supply 102 via HV supply line 112, and an HVOUT port for providing power to the HV load 108 via an HV output power rail 109. In one embodiment, the HV load 108 may comprise one or more HV components of the data storage device. For example, the HV components of the data storage device may include a spindle motor and a voice coil motor (VCM). In one embodiment, the low supply voltage may be approximately 5V and the high supply voltage may be approximately 12V. In other embodiments, the low supply voltage may be less than or greater than 5V and the high supply voltage may be less than or greater than 12V. However, the high supply voltage is higher than the low supply voltage when there is no power fault on either the LV or HV supply line 110, 112, such as when the power control module 100 is operating such that the low output voltage at the LVOUT port and the high output voltage at the HVOUT port are within a predetermined operating range as specified for proper operation of the respective LV and HV loads 106, 108.

As shown in FIG. 1A, power control module 100 also comprises control circuitry 114, an LV isolation circuit 116, an HV isolation circuit 118, an LV protection circuit 120, an HV protection circuit 122, a bypass circuit 124, a backup power generator 126, a supply voltage monitor 128, and a power supply 130. In one embodiment, all of the components of the power control module 100 reside on the same integrated circuit (IC). In one embodiment, the power control module 100 resides in a power system (e.g., a Power Large Scale Integration (PLSI) or a power Application Specific Integrated Circuit (ASIC)) in a data storage device. In the embodiment shown in FIG. 1A, the control circuitry 114 may comprise, for example, a microprocessor or combinatory logic and is configured to control the operation of the LV and HV isolation circuits 116, 118, the LV and HV protection circuits 120, 122, the bypass circuit 124, and the backup power generator 126. In one embodiment, the control circuitry 114 may comprise a state machine.

In the embodiment shown in FIG. 1A, the LV isolation circuit 116 is coupled between the LVIN port and LV node and the HV isolation circuit 118 is coupled between the HVIN port and HV node. In the embodiment in FIG. 1A, the LV and HV isolation circuits 116 and 118 each comprise a FET (e.g., an ISOFET) that includes an intrinsic body diode (i.e., parasitic diode) (as shown in FIG. 1A). In the embodiment shown in FIG. 1A, the parasitic diode provides reverse current blocking in the LV and HV isolation circuits. In other embodiments, LV and HV isolation circuits 116 and 118 may each comprise, for example, an eFuse, load switch or other type of semiconductor device or devices configured to operate as a switch. In some embodiments, LV isolation circuit 116 and/or HV isolation circuit 118 may be situated external to an IC on which the other components of power control module 100 reside. In the embodiment in FIG. 1A, the LV isolation circuit 116 is configured to operate in either an ON state (i.e., a closed state) or an OFF state (i.e., an open state) in response to a control signal 132 from the control circuitry 114, and HV isolation circuit 118 is configured to operate in either an ON state or an OFF state in response to a control signal 134 from the control circuitry 114.

In the embodiment shown in FIG. 1A, the LV protection circuit 120 is coupled between the LV node and the LVOUT port and comprises a FET that can be linearly driven and a parasitic diode that provides forward (inrush) current protection. In one embodiment, the LV protection circuit 120 comprises an eFuse (an integrated FET). In another embodiment, the LV protection circuit 120 may comprise a different type of transistor device or circuit that can be linearly driven. In the embodiment in FIG. 1A, the LV protection circuit is configured to operate in an ON state, an OFF state, or an ohmic state in response to a control signal 144 from the control circuitry 114. When operating in an ohmic state, the LV protection circuit can be controlled by the control circuitry 114 to regulate (e.g., linearly regulate) a backup voltage at the LV node to safely drive the LVOUT port to maintain the low output voltage at the LVOUT port within a predetermined operating range, which may be determined to be within operating specifications of the LV load 106.

In the embodiment shown in FIG. 1A, the LV protection circuit 120 further comprises a temperature sensor 136, a current sensor 138, and comparators 140 and 142. In the embodiment shown in FIG. 1A, the temperature sensor 136 is situated sufficiently close to the FET in the LV protection circuit 120 so as to enable it to receive thermal energy from the FET. As shown in the embodiment in FIG. 1A, a temperature sensor signal provided by the temperature sensor 136 is coupled to the positive input of comparator 140, an over-temperature reference (OT REF) (e.g., an OT reference voltage) is coupled to the negative input of comparator 140, and the output of the comparator 140 is coupled to the OT input of the control circuitry 114. In an embodiment, comparator 140 is configured to compare the temperature sensor signal outputted by the temperature sensor 136 to the OT reference and to provide an indication of an OT condition to the control circuitry 114 when the temperature sensor signal exceeds the OT reference.

As shown in FIG. 1A, the current sensor 138 is coupled between the FET in the LV protection circuit 120 and the LVOUT port and situated in a current path extending from the LVIN port to the LVOUT port, the output of the current sensor 138 is coupled to the positive input of comparator 142, an over-current reference (OC REF) (e.g., an OC reference voltage) is coupled to the negative input of comparator 142, and the output of comparator 142 is coupled to the OC input of the control circuitry 114. Comparator 142 is configured to compare a current sensor signal outputted by the current sensor 138 to the OC reference and to provide an indication of an OC condition to the control circuitry 114 when the current sensor signal exceeds the OC reference.

In the embodiment shown in FIG. 1A, the HV protection circuit 122 is coupled between the HV node and the HVOUT port and comprises a FET that can be linearly driven and a parasitic diode, and is configured to provide forward (inrush) current protection and overvoltage protection. In one embodiment, the HV protection circuit 122 comprises an eFuse. In another embodiment, the HV protection circuit 122 may comprise a different type of transistor device or circuit that can be linearly driven. In the embodiment in FIG. 1A, the HV protection circuit is configured to operate in an ON state, an OFF state, or an ohmic state in response to a control signal 146 from the control circuitry 114. When operating in an ohmic state, the HV protection circuit can be controlled by the control circuitry 114 to regulate (e.g., linearly regulate) a high supply voltage at the HVIN port to safely drive the LVOUT port to maintain the high output voltage at the LVOUT port within a predetermined operating range, which may be determined to be within operating specifications of the HV load 108.

In the embodiment shown in FIG. 1A, the bypass circuit 124 is coupled between the LV node and the HV node. In the embodiment in FIG. 1A, the bypass circuit 124 comprises a FET that includes a parasitic diode. In other embodiments, the bypass circuit 124 may comprise, for example, an eFuse, load switch or other type of semiconductor device or devices configured to operate as a switch. In the embodiment in FIG. 1A, the bypass circuit 124 is configured to operate in either an ON state (i.e., a closed state) or an OFF state (i.e., an open state) in response to a control signal 147 from the control circuitry 114.

In the embodiment shown in FIG. 1A, the backup power generator 126 is coupled to backup power source 104 via I/O ports 148, 150, and 152, coupled to the HVOUT port, and coupled to the HV node via the HV protection circuit 122. In embodiment in FIG. 1A, the backup power source 104 comprises a spindle motor 154 to provide backup energy. In other embodiments, the backup power source 104 may comprise one or more capacitors, one or more batteries, or other type of charge storage element(s). In the embodiment in FIG. 1A, the backup power generator 126 is controlled by the control circuitry 114 via control line 158 and comprises a spindle driver circuit 156. In response to a control signal from the control circuitry 114 via control line 158, the spindle driver circuit 156 is configured to operate in a power good mode, in which the low supply voltage at the LVIN port is within a predetermined LV range and the high supply voltage at the LVIN port is within a predetermined HV range, and extract energy from the HVOUT port to provide power to the spindle motor 154 via I/O ports 148, 150, and 152, or operate in a power fault detection (hold-up) mode, in which a power fault has been detected on either the LV supply line 110 or the high voltage supply line 112, and provide a backup voltage (also referred to as backup power in the patent application) to the HV node via the HV protection circuit 122.

In the embodiment shown in FIG. 1A, the supply voltage monitor 128 is coupled to the LVIN and HVIN ports and is configured to monitor the low and high supply voltages on the respective LV and HV supply lines 110, 112 from the external power supply 102, and notify the control circuitry 114 via output line 160 when a power fault is detected on either the LV supply line 110 or the HV supply line 112. In the embodiment shown in FIG. 1A, a power fault may be detected when the low supply voltage on the LV supply line 110 falls below a predetermined minimum voltage level or the high supply voltage on the HV supply line 112 falls below a predetermined minimum voltage level. For example, in an embodiment in which the low supply voltage is approximately 5V and the high supply voltage is approximately 12V when no power fault is detected on either of the LV and HV supply lines 110, 112, a power fault may be detected when either the low supply voltage on the LV supply line 110 falls below approximately 4V or the high supply voltage on the HV supply line 112 falls below approximately 10V. In one embodiment, the supply voltage monitor 128 may comprise an ADC channel for monitoring the LV supply line 110 and an ADC channel for monitoring the HV supply line 112. In another embodiment, the supply voltage monitor 128 may comprise other monitoring mechanisms or circuits for voltage monitoring.

In the embodiment shown in FIG. 1A, the power supply 130 is coupled to the HV node and is configured to provide operating power to components (e.g., the LV and HV isolation circuits 116, 118, the LV and HV protection circuits 120, 122, the bypass circuit 124, the backup power generator 126, and the supply voltage monitor 128) of the power control module 100. For example, the power supply 130 is configured to provide the operating voltages (such as bias voltages) each of the aforementioned components of the power control module 100 require for proper operation.

The operating modes of the power control module 100 will now be discussed with reference to table 175 in FIG. 1B. As shown in table 175 in FIG. 1B, the power control module 100 in the embodiment in FIG. 1A can operate in a power good mode, a hold-up mode, an undervoltage (UV) lockout mode, and a power on ramp mode. The control circuitry 114 places the power control module 100 in the power good mode when the low supply voltage (from the external power supply 102) at the LVIN port is within a predetermined low voltage operating range and the high supply voltage (from the external power supply 102) at the HVIN port is within a predetermined high voltage operating range. In the power good mode, the control circuitry 114 sets the isolation circuit 116 and the LV protection circuit 120 to the ON state (i.e., a closed state), which opens the current path between the LVIN port and the LVOUT port to cause the low supply voltage at the LVIN port to be provided at the LVOUT port to provide power to the LV load 106.

In the power good mode, the control circuitry 114 also sets the HV isolation circuit 118 and the HV protection circuit 122 to the ON state, thereby opening the current path between the HVIN port and the HVOUT port to cause the high supply voltage at the HVIN port to be provided at the HVOUT port to power the HV load 108. In the power good mode, the control circuitry 114 further sets the bypass circuit 124 to the OFF state (i.e., an open state), which isolates the HV node from the LV node by preventing current to flow from the HV node to the LV node or vice versa. Also, in the embodiment shown in FIG. 1A, in the power good mode, power is applied to the spindle driver circuit 156, which provides power to the spindle motor 154 in the backup power source 104. In an embodiment in which the backup power source 104 comprises one or more capacitors, for example, the backup power generator 126 may comprise circuitry, such as a boost switching regulator (BSR), to charge the one or more capacitors in the power good mode. In another embodiment, the backup power source 104 may comprise one or more batteries and circuitry to charge the batteries in the power good mode.

When the control circuitry 114 detects a power fault on either the LV or HV supply line 110, 112 via a power fault indication from the supply voltage monitor 128 on output line 160, the control circuitry 114 places the power control module 100 in the hold-up mode. In the embodiment shown in FIG. 1A, the power fault may be an undervoltage condition on either the LV or HV supply line 110, 112. In the hold-up mode, the control circuitry 114 sets the LV and HV isolation circuits 116, 118 to the OFF state, which isolates the LV and HV supply lines 110, 112 of the external power supply 102 from the respective LV and HV nodes. In the hold-up mode, the control circuitry 114 also sets the bypass circuit 124 to the ON state, the LV protection circuit 120 to an ohmic state, the HV protection circuit 122 to the ON state, as shown in table 175 in FIG. 1B, and causes the backup power generator 126 to provide a backup voltage to the HV node via the HV protection circuit 122. In one embodiment, the backup voltage is higher than the high supply voltage provided at the HVOUT port in the power good mode. In another embodiment, the backup voltage is higher than the low supply voltage provided at the LVOUT port in the power good mode but lower than the high supply voltage provided at the HVOUT port in the power good mode.

In the embodiment shown in FIG. 1A, the spindle driver circuit 156 in the backup power generator 126 is configured in the hold-up mode to receive motor energy from the spindle motor 154 in the backup power source 104 via I/O ports 148, 150, and 152, and convert the motor energy into the backup voltage. In the embodiment shown in FIG. 1A, the spindle driver circuit 156 comprises a boost circuit (not shown in FIG. 1A) to provide a backup voltage having a higher voltage level than the high output voltage provided at the HVOUT port in the power good mode. In one embodiment, the motor energy may be rectified or synchronously rectified by the spindle driver circuit 156 to provide a backup voltage that is higher than the low output voltage at the LVOUT port in the power good mode but lower than the high output voltage at the HVOUT port in the power good mode, which reduces thermal dissipation in the LV protection circuit 120 in the hold-up mode.

In the hold-up mode, the backup voltage at the HV node is provided to the LV node via the bypass circuit 124, and regulated (e.g., linearly regulated) by the LV protection circuit 120 to maintain the low output voltage at the LVOUT port to within a predetermined operating range. For example, the predetermined operating range may be determined by the operating specifications of the LV load 106. In one embodiment, the control circuitry 114 appropriately drives the LV protection circuit 120 to set the low output voltage at the LVOUT port to be higher than a mid-point of the predetermined operating range to reduce thermal dissipation in the LV protection circuit 120. When the LV and HV isolation circuits 116, 118 are set to the OFF state in the hold-up mode, they provide reverse current protection by preventing current from flowing from the respective LV and HV nodes to the external power supply 102 via the LV and HV supply lines 110, 112.

When the backup power provided by the backup power generator 126 in the hold-up mode falls below a level that is required to operate the LV load 106, the control circuitry 114 places the power control module 100 in the UV lockout mode by setting the bypass circuit 124 and the LV and HV protection circuits 120, 122 to the OFF state. In the UV lockout mode, the LV and HV isolation circuits 116, 118 remain set to the OFF state. Thus, in the UV lockout mode, the power control module 100 is effectively turned off (i.e., in shutdown).

In the embodiment shown in FIG. 1A, the control circuitry 114 places the power control module 100 in the power on ramp mode to ramp up the low output voltage on the LVOUT port and the high output voltage on the HVOUT port. In the power on ramp mode, the control circuitry 114 sets the LV and HV isolation circuits 116, 118 to the ON state, the bypass circuit 124 to the OFF state, and the LV and HV protection circuits 120, 122 to the ohmic state, as shown in table 175 in FIG. 1B. When the bypass circuit 124 is set to the OFF state and the LV and HV isolation circuits 116, 118 are set to the ON state, the high supply voltage from the HV supply line 112 on the HV node is isolated from the low supply voltage from the LV supply line 110 on the LV node. In the ohmic state, the LV protection circuit 120 is controlled by the control circuitry 114 via control signal 144 to control the slew rate of the low output voltage at the LVOUT port. Similarly, in the ohmic state, the HV protection circuit 122 is controlled by the control circuitry 114 via control signal 146 to control the rate of the high output voltage ramp up at the HVOUT port. When the respective low and high output voltages at the LVOUT and HVOUT ports reach their steady state levels and finish ramping up, the control circuitry 114 sets the LV and HV protection circuits 120, 122 to the ON state to end the power on ramp mode.

Figure 2A:
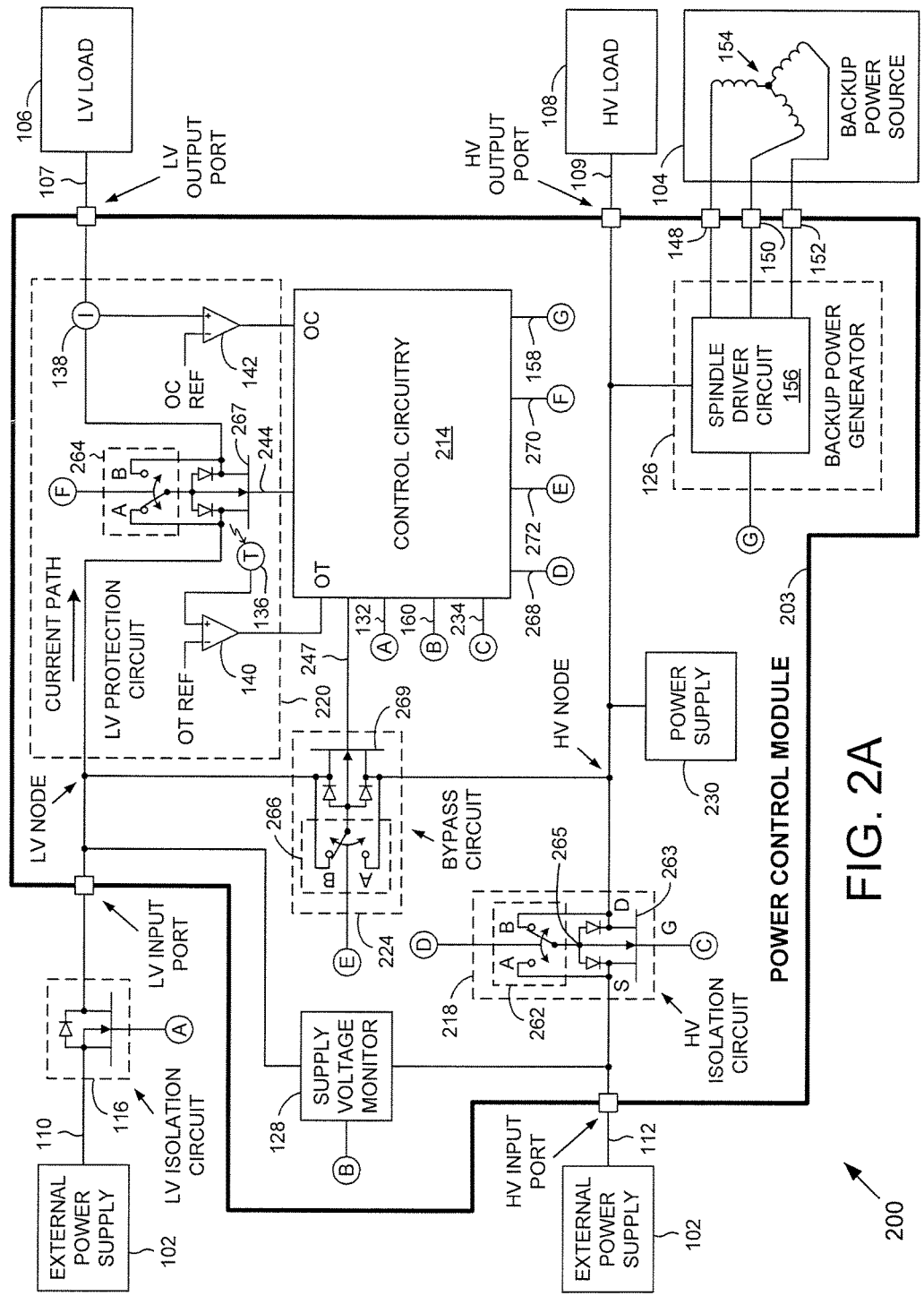
FIG. 2A is a block diagram showing a power control module coupled to an external power supply, a backup power source, and LV and HV loads, wherein, when a power fault is detected on either an LV or an HV line from the external power supply, a backup voltage from the backup power source is coupled, via a bypass circuit, to an LV protection circuit to provide power to the LV load, in accordance with one embodiment of the invention.

FIG. 2A shows a power control module 200 coupled to an external power supply 102, a backup power source 104, an LV load 106, and an HV load 108, in accordance with one embodiment of the invention. To avoid duplicate description and preserve brevity, only the differences between power control module 200 in FIG. 2A and power control module 100 in FIG. 1A will be described herein. As shown in FIG. 2A, power control module 200 comprises control circuitry 214, an LV isolation circuit 116, an HV isolation circuit 218, an LV protection circuit 220, a bypass circuit 224, a backup power generator 126, a supply voltage monitor 128, a power supply 230, LVIN, LVOUT, HVIN, and HVOUT ports, and I/O ports 148, 150, and 152. In the embodiment shown in FIG. 2A, all of the components of power control module 200 shown within solid line 203 are situated on the same IC (e.g., a PLSI or ASIC), and the LV isolation circuit 116 is situated external to the IC. In one embodiment, LV isolation circuit 116 may be coupled between the LVIN port and the LV node and situated on the same IC with the other components of power control module 200 shown within the solid line 203.

In the embodiment shown in FIG. 2A, the control circuitry 214 may comprise, for example, a microprocessor or combinatory logic and is configured to control the operation of the LV and HV isolation circuits 116, 218, the LV protection circuit 120, the bypass circuit 224, and the backup power generator 126. In one embodiment, the control circuitry 214 may comprise a state machine.

As shown in FIG. 2A, the LV isolation circuit 116 is coupled between the external power supply 102 and the LVIN port and the HV isolation circuit 218 is coupled between the HVIN port and the HV node. In the embodiment shown in FIG. 2A, the HV isolation circuit 218 comprises a FET 263 that can be linearly driven, two intrinsic body diodes (i.e., parasitic diodes), and a switch 262. The switch 262 may comprise, for example, two or more transistors (e.g., FETs) configured to operate as a switch. In one embodiment, the HV isolation circuit 218 may comprise a switched back-gate device. In other embodiments, the HV isolation circuit 218 may comprise an eFuse or a different type of transistor device or circuit that may be linearly driven, in addition to the parasitic diodes and the switch 262.

In the embodiment shown in FIG. 2A, the anodes of the parasitic diodes in the HV isolation circuit 218 are coupled to a body node 265 of the FET 263, the cathode of one of the parasitic diodes is coupled to the source (S) of the FET 263, and the cathode of the other parasitic diode is coupled to the drain (D) of the FET 263. In the embodiment shown in FIG. 2A, the FET 263 in the HV isolation circuit 218 is configured to operate in an ON state, an OFF state, or an ohmic state in response to a control signal 234 from the control circuitry 214 applied to the gate (G) of the FET 263, and the switch 262 in the HV isolation circuit 218 is configured to operate in an "A" or "B" position in response to a control signal 268 from the control circuitry 214.

In the embodiment shown in FIG. 2A, when the switch 262 in the HV isolation circuit 218 is in the "A" position, the anode of one of the parasitic diodes is coupled to the source of the FET 263, its cathode is coupled to the drain of the FET 263, and the anode and cathode of the other parasitic diode are shorted together. Thus, when the switch is in the "A" position, the selected parasitic diode points from the source to the drain of the FET 263 (i.e., the cathode of the selected parasitic diode is coupled to the drain of the FET 263 and its anode is coupled to the source of the FET 263). When the switch 262 of the HV isolation circuit 218 is in the "B" position, the selected parasitic diode points from the drain to the source of the FET 263 (i.e., the cathode of the selected parasitic diode is coupled to the source of the FET 263 and its anode is coupled to the drain of the FET 263).

In the embodiment shown in FIG. 2A, the "state" the HV isolation circuit 218 is configured to operate in is indicated using a format that combines the state of the FET 263 and the position of the switch 262 in the HV isolation circuit 218. Using the above format, in the embodiment in FIG. 2A, the HV isolation circuit 218 is configured to operate in an ON-A state, in which the FET 263 is set to the ON state and the switch 262 is set to the "A" position, an OFF-A state, in which the FET 263 is set to the OFF state and the switch 262 is set to the "A" position, and an ohmic-B state, in which the FET 263 is set to the ohmic state and the switch 262 is set to the "B" position. The switch 262 provides switchable reverse or forward current protection to the HV isolation circuit 218 by appropriately switching the orientation of the selected parasitic diode. The same format as described above is also used to indicate the operating states of the bypass circuit 224 and the LV protection circuit 220.

In the embodiment shown in FIG. 2A, the LV protection circuit 220 is coupled between the LVIN port and the LVOUT port and comprises a FET 267 that can be linearly driven, two parasitic diodes, and a switch 264. The switch 264 may comprise, for example, two or more transistors (e.g., FETs) configured to operate as a switch. In one embodiment, the LV protection circuit 220 may comprise a switched back-gate device. In other embodiments, the LV protection circuit 220 may comprise an eFuse or a different type of transistor device or circuit that can be linearly driven, in addition to the parasitic diodes and the switch 264.

In the embodiment shown in FIG. 2A, the FET 267 in the LV protection circuit 220 is configure to operate in an ON state, an OFF state, or an ohmic state in response to a control signal 244 from control circuitry 214 applied to the gate of the FET 267, and the switch 264 in the LV protection circuit 220 is configured to operate in an "A" or "B" position in response to a control signal 270 from the control circuitry 214. When the switch 264 is in the "A" position, the selected parasitic diode points from the source to the drain of the FET 267, and when the switch 264 is in the "B" position, the selected parasitic diode points from the drain to the source of the FET 267. When the switch 264 is in the "A" or "B" position, the unselected parasitic diode has its anode shorted to its cathode, as previously described with respect to the HV isolation circuit 218. In the embodiment shown in FIG. 2A, the LV protection circuit 220 is configured to operate in an ON-A state (i.e., when the FET 267 is in the ON state and the switch 264 in the "A" position), an OFF-B state (i.e., when the FET 267 is in the OFF state and the switch 264 is in the "B" position), and an ohmic-B state (i.e., when the FET 267 is in the ohmic state and the switch 264 is in the "B" position).

In the embodiment shown in FIG. 2A, the bypass circuit 224 is coupled between the HV node and the LV node and comprises a FET 269 that can be linearly driven, two parasitic diodes, and a switch 266. The switch 266 may comprise, for example, two or more transistors (e.g., FETs) configured to operate as a switch. In one embodiment, the bypass circuit 224 may comprise a switched back-gate device. In other embodiments, the bypass circuit 224 may comprise an eFuse or a different type of transistor device or circuit that can be linearly driven, in addition to the parasitic diodes and the switch 266.

In the embodiment shown in FIG. 2A, the FET 269 in the bypass circuit 224 is configure to operate in the ON state or the OFF state in response to a control signal 247 from control circuitry 214 applied to the gate of the FET 269, and the switch 266 in the bypass circuit 224 is configured to operate in an "A" or "B" position in response to a control signal 272 from the control circuitry 214. When the switch 266 is in the "A" position, the selected parasitic diode points from the source to the drain of the FET 269, and when the switch 266 is in the "B" position, the selected parasitic diode points from the drain to the source of the FET 269. When the switch 266 is in the "A" or "B" position, the unselected parasitic diode has its anode shorted to its cathode, as previously described with respect to the HV isolation circuit 218. In the embodiment shown in FIG. 2A, the bypass circuit 224 is configured to operate in an ON-A state (i.e., when the FET 269 is in the ON state and the switch 266 in the "A" position), an OFF-A state (i.e., when the FET 269 is in the OFF state and the switch 266 is in the "A" position), and an OFF-B state (i.e., when the FET 269 is in the OFF state and the switch 266 is in the "B" position).

In the embodiment shown in FIG. 2A, the power supply 230 is coupled to the HV node and is configured to provide operating power to components (e.g., the LV and HV isolation circuits 116, 218, the LV protection circuit 220, the bypass circuit 224, the backup power generator 126, and the supply voltage monitor 128) of the power control module 200. For example, the power supply 230 is configured to provide the operating voltages (such as bias voltages) that each of the aforementioned components of the power control module 200 require for proper operation.

The operating modes of the power control module 200 will now be discussed with reference to table 275 in FIG. 2B. As shown in table 275 in FIG. 2B, the power control module 200 in the embodiment in FIG. 2A can operate in a power good mode, a hold-up mode, a UV lockout mode, a power on ramp stage 1 mode, and a power on ramp stage 2 mode. In the embodiment in FIG. 2A, the control circuitry 214 places the power control module 200 in the power good mode when the low supply voltage (from the external power supply 102) at the LVIN port is within a predetermined low voltage operating range and the high supply voltage (from the external power supply 102) at the HVIN port is within a predetermined high voltage operating range. In the power good mode, the control circuitry 214 sets the isolation circuit 116 to the ON state and the LV protection circuit 220 to the ON-A state, which opens the current path between the low voltage supply line 110 and the LVOUT port to cause the low supply voltage from the external power supply 102 to be provided at the LVOUT port to provide power to the LV load 106. By setting the switch 264 in the LV protection circuit 220 in the "A" position, the selected parasitic diode in the LV protection circuit 220 provides reverse current protection (i.e., it prevents current from flowing back from the LVOUT port to the LVIN port and the external power supply 102) while allowing forward current flow from the LVIN port to the LVOUT port.

In the power good mode, the control circuitry 214 also sets the HV isolation circuit 218 to an ON-A state, which opens the current path between the HVIN port and the HVOUT port to cause the high supply voltage from the external power supply 102 at the HVIN port to be provided at the HVOUT port to provide power to the HV load 108. By setting the switch 262 in the HV isolation circuit 218 in the "A" position, the selected parasitic diode in the HV isolation circuit 218 provides reverse current protection (i.e., it prevents current from flowing back from the HVOUT port to the HVIN port and the external power supply 102) while allowing forward current flow from the HVIN port to the HVOUT port.

In the power good mode in the embodiment shown in FIG. 2A, the control circuitry 214 further sets the bypass circuit 224 to the OFF-B state, which isolates the HV node from the LV node. By setting the switch 266 in the bypass circuit 224 in the "B" position, the selected parasitic diode in the bypass circuit 224 provides reverse current protection (i.e., it prevents current from flowing from the HV node to the LV node). Also, in the embodiment shown in FIG. 2A, in the power good mode, power is applied to the spindle driver circuit 156, as discussed above with respect to the power good mode in the power control module 100 in the embodiment shown in FIG. 1A.

When the control circuitry 214 detects a power fault on either the LV or HV supply line 110, 112 via a power fault indication from the supply voltage monitor 128 on output line 160, the control circuitry 214 places the power control module 200 in the hold-up mode. In the embodiment shown in FIG. 2A, the power fault may be an undervoltage condition on either the LV or HV supply line 110, 112. In the hold-up mode, the control circuitry 214 sets the LV isolation circuit 116 to the OFF state and the HV isolation circuit 218 to the OFF-A state, which isolates the LV and HV supply lines 110, 112 of the external power supply 102 from the respective LV and HV nodes. By setting the switch 262 in the HV isolation circuit 218 to the "A" position, the selected parasitic diode in the HV isolation circuit 218 provides reverse current protection (i.e., it prevents current from flowing from the HV node to the HVIN port and the external power supply 102 via the high voltage supply line 112).

In the hold-up mode in the embodiment shown in FIG. 2A, the control circuitry 214 also sets the bypass circuit 224 to the ON-A state, the LV protection circuit 220 to the ohmic-B state, and causes the backup power generator 126 to provide a backup voltage to the HV node. In one embodiment, the backup voltage is higher than the high supply voltage provided at the HVOUT port in the power good mode. In another embodiment, the backup voltage is higher than the low supply voltage provided at the LVOUT port in the power good mode but lower than the high supply voltage provided at the HVOUT port in the power good mode. By setting the switch 266 in the bypass circuit 224 to the "A" position, the selected parasitic diode in the bypass circuit 224 provides forward current flow from the HV node to the LV node. Also, by setting the switch 264 in the LV protection circuit 220 to the "B" position, the selected parasitic diode in the LV protection circuit 220 provide reverse current protection by preventing current flow from the LVOUT port to the LVIN port.

In the embodiment shown in FIG. 2A, the spindle driver circuit 156 in the backup power generator 126 is configured in the hold-up mode to receive motor energy from the spindle motor 154 in the backup power source 104 via I/O ports 148, 150, and 152, and convert the motor energy into the backup voltage, as described above with respect to the hold-up mode in the power control module 100 in the embodiment shown in FIG. 1A. Also, the methods described above for reducing thermal dissipation in the LV protection circuit 120 in the hold-up mode in the embodiment in FIG. 1A also apply to the LV protection circuit 220 in the hold-up mode in the embodiment in FIG. 2A.

In the hold-up mode, in the embodiment in FIG. 2A, the backup voltage at the HV node is provided to the LV node via the bypass circuit 224, and regulated (e.g., linearly regulated) by the LV protection circuit 220 to maintain the low output voltage at the LVOUT port to within a predetermined operating range. For example, the predetermined operating range may be determined by the operating specifications of the LV load 106. In one embodiment, the control circuitry 214 appropriately drives the LV protection circuit 220 to set the low output voltage at the LVOUT port to be higher than a mid-point of the predetermined operating range to reduce thermal dissipation in the LV protection circuit 220. When the LV and HV isolation circuits 116, 218 are turned to the OFF state in the hold-up mode, they provide reverse current protection by preventing current from flowing from the respective LV and HV nodes to the external power supply 102 via the LV and HV supply lines 110, 112.

When the backup power provided by the backup power generator 126 in the hold-up mode falls below a level that is required to operate the LV load 106, the control circuitry 214 places the power control module 200 in the UV lockout mode by setting the bypass circuit 224 and the LV protection circuit 220 to the OFF state. In the UV lockout mode, the LV and HV isolation circuits 116, 218 remain set to the OFF state (as they were in the hold-up state). Thus, in the UV lockout mode, the power control module 200 is effectively turned off (i.e., in shutdown).

In the embodiment shown in FIG. 2A, when the external power supply 102 is enabled to provide power to the power control module 200, the control circuitry 214 monitors the LV and HV supply lines 110, 112 at the respective LVIN and HVIN ports via the supply voltage monitor 128 to determine whether to place the power control module 200 in the power on ramp stage 1 or the power on ramp stage 2 operating mode to ramp up the low and high output voltages on the respective LVOUT and HVOUT ports. Since the parasitic diode in the LV isolation circuit 116 allows current to flow from the external power supply to the LVIN port, the LV isolation 116 does not have to be in the ON state for the above determination to be made. However, in one embodiment, the LV isolation circuit 116 is set to the ON state prior to determining whether to place the power control module 200 in the power on ramp stage 1 or stage 2 operating mode.

In the embodiment shown in FIG. 2A, if the control circuitry 214 determines that the low supply voltage starts to ramp up at the LVIN port before the high supply voltage starts to ramp up at the HVIN port, the control circuitry 214 places the power control module 200 in the power on ramp stage 1 operating mode. On the other hand, if the control circuitry 214 determines that the high supply voltage starts to ramp up at the HVIN port before the low supply voltage starts to ramp up at the LVIN port, the control circuitry 214 places the power control module 200 in the power on ramp stage 2 operating mode. In either the power on ramp stage 1 or stage 2 operating mode, the power control circuitry 214 sets LV isolation circuit 116 to the ON state, the HV isolation circuit 218 to the ohmic-B state, and the LV protection circuit 220 to the ohmic-B state, as shown in the table 275 in FIG. 2B.

In the power on ramp stage 1 operating mode, the control circuitry 214 sets the bypass circuit 224 to the OFF-A state to prevent current flow from the LV node to the HV node when the voltage at the LV node is initially higher than the voltage at the HV node. In the power on ramp stage 2 operating mode, the control circuitry 214 sets the bypass circuit 224 to the OFF-B state to prevent current flow from the HV node to the LV node when the voltage at the HV node is higher than the voltage at the LV node. In the embodiment shown in FIG. 2A, if the control circuitry 214 places the power control module 200 in the power on ramp stage 1 operating mode, when the high supply voltage at the HVIN port begins to ramp up to a level that is higher than the low supply voltage at the LVIN port, the control circuitry 214 switches the power control module 200 to the power on ramp stage 2 operating mode to prevent current flow from the HV node to the LV node.

In either the power on ramp stage 1 or stage 2 operating mode in the embodiment in FIG. 2A, the LV isolation circuit 116 is set to the ON state to enable full current flow from the external power supply 102 to the LVIN port, the LV protection circuit 220 is set to the ohmic-B state to control the slew rate of the low output voltage at the LVOUT port and provide forward (i.e., inrush) current protection via the orientation of the parasitic diode that is selected by switch 264, and the HV isolation circuit 218 is set to the ohmic-B state to control the slew rate of the high output voltage at the HVOUT port and provide forward current protection via the orientation of the parasitic diode selected by switch 262. When the respective low and high output voltages at the LVOUT and HVOUT ports finish ramping up and reach their steady state levels, the control circuitry 214 sets the LV protection circuit 220 and the HV isolation circuit 218 to the ON-A state to end the power on ramp mode.

Figure 3:
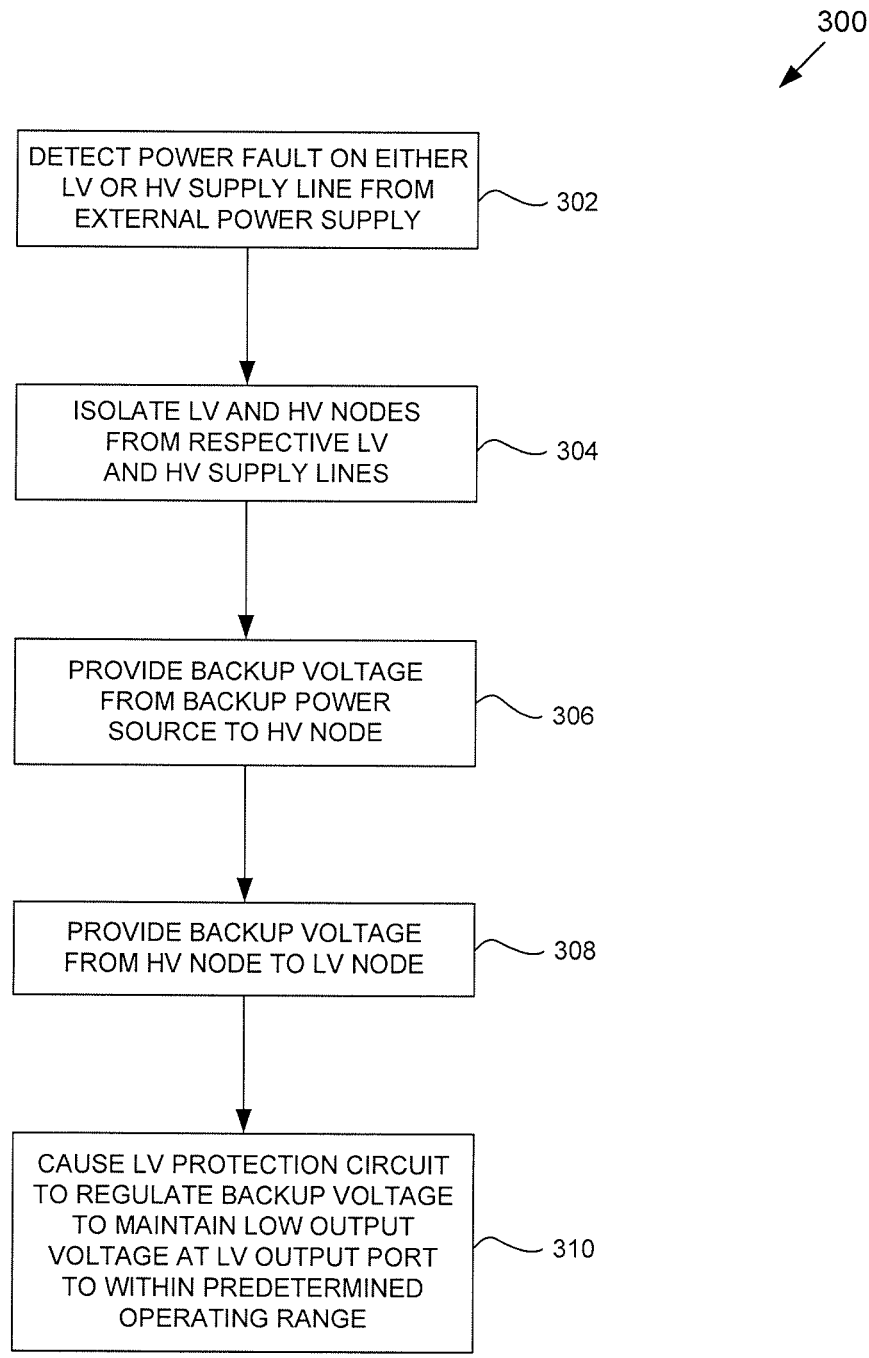
FIG. 3 is a flow diagram showing a process in which, after a power fault is detected on either an external LV or HV supply line, a backup voltage provided to an LV protection circuit via a bypass circuit and linearly regulated by the LV protection circuit to maintain a low output voltage at an LV output port, in accordance with one embodiment of the invention.

FIG. 3 shows a process 300 for detecting a power fault on either an LV supply line 110 or an HV supply 112 of an external power supply 102 (FIG. 1A, 2A), supplying a backup voltage from an HV node to an LV node via a bypass circuit 124 (FIG. 1A), 224 (FIG. 2B) of a power control module 100 (FIG. 1A), 200 (FIG. 2A), and regulating the backup voltage at the LV node via an LV protection circuit 120 (FIG. 1A), 220 (FIG. 2A) of the power control module 100, 200 to maintain a low output voltage at the LV output port of the power control module 100, 200, in accordance with one embodiment of the invention. The process 300 can be implemented by control circuitry 114 (FIG. 1A), 214 (FIG. 2A) of the power control module 100, 200. In one embodiment, the power control module 100,200 may be situated in a data storage device (e.g., an HDD or an SSHD).

The process 300 starts in block 302, where a power fault (e.g., an undervoltage condition) is detected on either an LV or an HV supply line of an external power supply. In the embodiments shown in FIGS. 1A and 2A, the power fault may be detected at an LVIN or HVIN port of the power control module via a supply voltage monitor 128 (FIG. 1A, 2A), which may comprise, for example, an ADC channel for monitoring the LV supply line and the HV supply line. In block 304, the process 300 isolates the respective LV and NV nodes from the external power supply LV and HV supply lines. In the embodiment shown in FIG. 1A, LV and HV isolation circuits are set to the OFF state to isolate the respective LV and HV nodes from the external power supply LV and HV supply lines.

In block 306, the process 300 provides a backup voltage from a backup power source to the HV node. In the embodiment shown in FIG. 1A, the backup voltage is generated by a backup power generator 126 coupled to the backup power source 104 and provided to the HV node via an HV protection circuit 122, which is set to the ON state to allow current to flow from the backup power generator to the HV node. In the embodiments of the invention shown in FIGS. 1A and 2A, the backup power source 104 comprises a spindle motor 154, which generates backup energy that is used to provide the backup voltage. In block 308, the process 300 provides the backup voltage from the HV node to the LV node. In the embodiment shown in FIG. 1A, the backup voltage is provided from the HV node to the LV node by setting to the ON state the bypass circuit 124, which is coupled between the HV node and the LV node.

In block 310, the process 300 causes an LV protection circuit to regulate the backup voltage to maintain a low output voltage at an LV output (LVOUT) port to within a predetermined operating range. In the embodiment shown in FIG. 1A, the LV protection circuit 120 is coupled between the LV node and the LVOUT port and is set to an ohmic state to enable it to linearly regulate the backup voltage. For example, the predetermined operating range may be determined to be within operating specifications of an LV load that is coupled to the LVOUT port. In one embodiment, the LV load may comprise low voltage components of a data storage device (e.g., an HDD or an SSHD).

Figure 4:
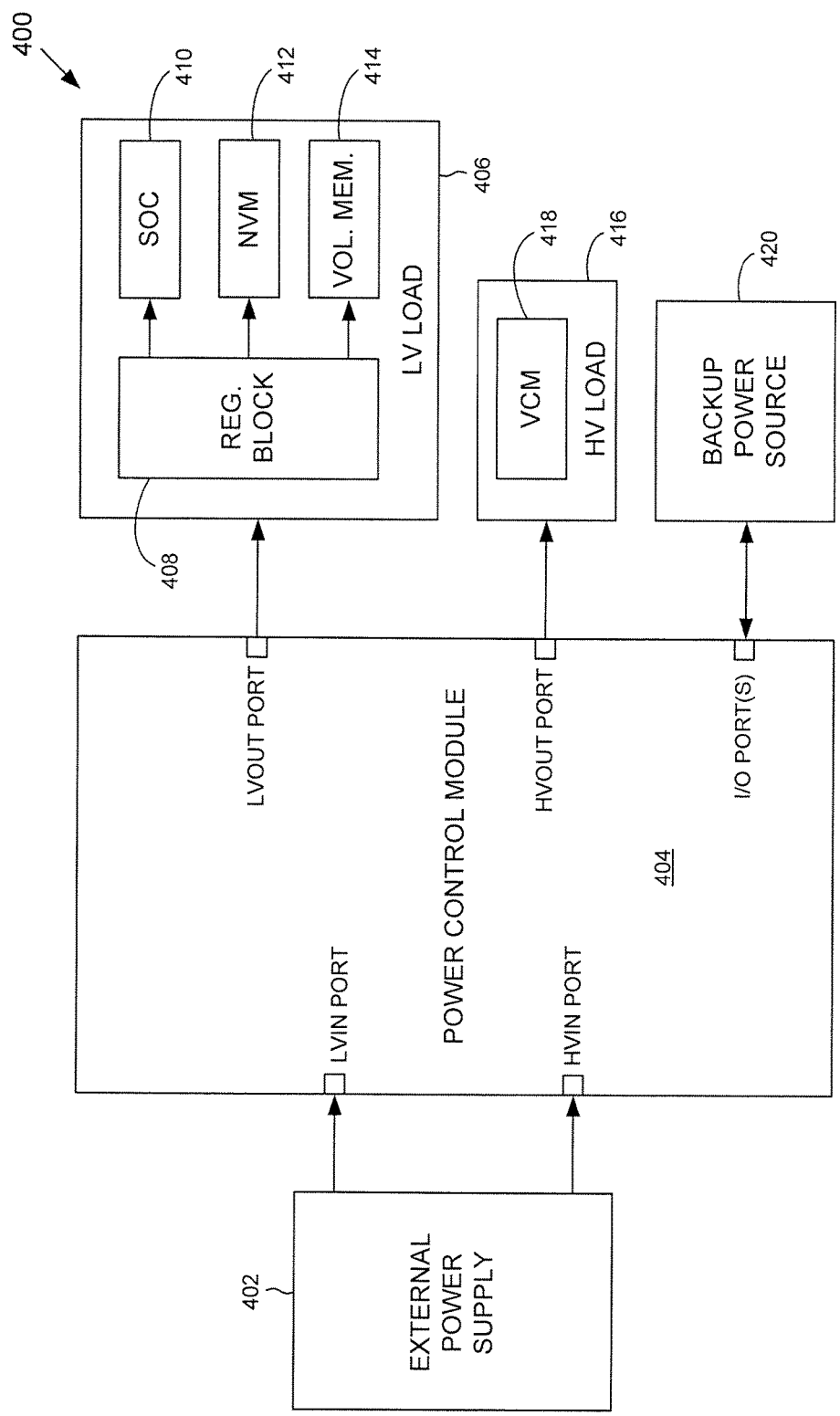
FIG. 4 is a block diagram of a data storage device comprising a power control module (e.g., the power control module in the embodiment shown in FIG. 1A or 2A), in accordance with one embodiment of the invention.

FIG. 4 shows a data storage device 400 coupled to an external power supply and comprising a power control module, in accordance with one embodiment of the invention. Data storage device 400 can be, for example, an HDD, an SSHD (a data store device comprising both rotating magnetic media and non-volatile semiconductor memory (NVSM, e.g., flash memory), or an SSD, and receives low and high supply voltages from the external power supply 402, which, in one embodiment, may be a host power supply residing in a computing device such as a desktop, laptop or tablet computer or be a standalone power supply. In the embodiment shown in FIG. 4, the data storage device 400 comprises a power control module 404, which can be, for example, power control module 100 or 200 shown in FIGS. 1A and 2A, respectively. The power control module 404 can reside in a PLSI or an ASIC, for example.

By providing a low cost bypass circuit comprising a single FET, an embodiment of the invention's power control module 404 may be integrated in a PLSI in a data storage device, and be used to hold up the LV (e.g., 5V) power rail in the data storage device using either motor energy or one or more capacitors or batteries during a power fault on either a LV or HV supply line. For example, during the power fault, the bypass circuit can short the HV node to the LV node to provide a backup voltage at the HV node to an LV protection circuit in the power control module 404, and rely on the LV protection circuit to linearly regulate the backup voltage to maintain a low output voltage on the LV power rail in the data storage device. An embodiment of the invention's power control module 404 can therefore provide a cost effective solution for using a backup power source (e.g., motor energy or one or more capacitors or batteries) to effect an emergency transfer of data from a volatile memory to a non-volatile memory (e.g., a disk or NAND flash memory) during a hold-up time that may be of short duration.

In the embodiment shown in FIG. 4, the data storage device 400 also comprises an LV load 406, which comprises low voltage components, such as a regulator block 408, an SOC 410 (which can comprise, for example, a controller), NVM 412, and volatile memory 414. In the embodiment in FIG. 4, the data storage device 400 further comprises an HV load 416, which comprises one or more high voltage components, such as a VCM 418. Additionally, the data storage device comprises a backup power source 420, which may comprise, for example, a spindle motor or one or more capacitors or batteries for providing backup power. It is noted that data storage device 400 also includes other components known to one of ordinary skill in the art but not shown in FIG. 4 so as not to obscure the various described embodiments of the invention.

In the embodiment shown in FIG. 4, the power control module 404 is configured to receive a low supply voltage from the external power supply 402 at an LVIN port, receive a high supply voltage from the external power supply 402 at an HVIN port, provide low output voltage at an LVOUT port, provide a high output voltage at an HVOUT port, and communicate with the backup power source 420 via one or more I/O ports.

While some embodiments of the invention have been described, these embodiments have been presented by way of example only, and are not intended to limit the scope of the disclosure. Indeed, the novel methods and devices described herein may be embodied in a variety of other forms. Furthermore, various omissions, substitutions and changes in the form of the methods and devices described herein may be made without departing from the spirit of the disclosure. For example, the various components described may be implemented as software and/or firmware on a processor, ASIC/FPGA, or dedicated hardware. As an additional example, some of the above described power module embodiments may be implemented in electronic devices other than data storage devices.

Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of protection is defined only by the claims.

What is claimed is:

1. A power control module coupled to an external power supply and a backup power source, the power control module comprising:
   a low voltage (LV) input port for receiving a low supply voltage from the external power supply via an LV supply line;
   a high voltage (HV) input port for receiving a high supply voltage from the external power supply via an HV supply line, wherein the high supply voltage is higher than the low supply voltage;
   an LV output port for providing a low output voltage to a low voltage load;
   an HV output port for providing a high output voltage to a high voltage load;
   an LV node coupled to the LV input port;
   an HV node coupled to the HV input port;
   a bypass circuit coupled between the LV and HV nodes;
   an LV protection circuit coupled between the LV node and the LV output port; and
   control circuitry configured to:
      detect a power fault on either the LV or the HV supply line;
      isolate the LV and HV nodes from the respective LV and HV supply lines;
      provide a backup voltage from the backup power source to the HV node;
      cause the bypass circuit to provide the backup voltage to the LV node; and
      cause the LV protection circuit to regulate the backup voltage at the LV node to maintain the low output voltage at the LV output port to within a predetermined operating range.

2. The power control module as recited in claim 1, further comprising an LV isolation circuit coupled between the external power supply and the LV node, wherein the control circuitry is further configured to turn the LV isolation circuit to an off state to isolate the LV node from the LV supply line when the power fault is detected.

3. The power control module as recited in claim 2, wherein the LV isolation circuit is coupled between the external power supply and the LV input port.

4. The power control module as recited in claim 2, wherein the LV isolation circuit is coupled between the LV input port and the LV node.

5. The power control module as recited in claim 1, further comprising an HV isolation circuit coupled between the HV input port and the HV node, wherein the control circuitry is further configured to cause the HV isolation circuit to isolate the HV node from the HV supply line when the power fault is detected.

6. The power control module as recited in claim 5, wherein the HV isolation circuit provides switched back-gate biasing to provide switchable reverse or forward current protection.

7. The power control module as recited in claim 1, wherein the control circuitry is further configured to cause the LV protection circuit to operate in an ohmic state to linearly regulate the backup voltage at the LV node.

8. The power control module as recited in claim 1, wherein the LV protection circuit comprises switched back gate biasing to provide switchable reverse or forward current protection.

9. The power control module as recited in claim 1, wherein the bypass circuit provides switched back gate biasing to provide switchable reverse or forward current protection.

10. The power control module as recited in claim 1, further comprising a supply voltage monitor coupled to the LV input port and the HV input port and configured to detect the power fault on either the LV or the HV supply line and provide a power fault notification signal to the control circuitry.

11. The power control module as recited in claim 1, wherein the control circuit is further configured to reduce thermal dissipation in the LV protection circuit by controlling the LV protection circuit to cause the low output voltage at the LV output port to be higher than a mid-point of the predetermined operating range.

12. The power control module as recited in claim 1, wherein the LV load comprises one or more low voltage components in a data storage device and the HV load comprises one or more high voltage components in the data storage device.

13. The power control module as recited in claim 1, wherein the power fault is an undervoltage condition.

14. An integrated circuit comprising the power control module as recited in claim 1.

15. A data storage device coupled to an external power supply, the data storage device comprising:
   one or more low voltage (LV) components;
   one or more high voltage (HV) components;
   a backup power source;
   a power control module comprising:
      an LV input port for receiving a low supply voltage from the external power supply via an LV supply line;
      an HV input port for receiving a high supply voltage from the external power supply via an HV supply line, wherein the high supply voltage is higher than the low supply voltage;
      an LV output port for providing a low output voltage to the one or more LV components, wherein the high supply voltage is higher than the low supply voltage;
      an HV output port for providing a high output voltage to the one or more HV components;

an LV node coupled to the LV input port;
an HV node coupled to the HV input port;
a bypass circuit coupled between the LV and HV nodes;
an LV protection circuit coupled between the LV node and the LV output port; and
control circuitry configured to:
    detect a power fault on either the LV or the HV supply line;
    isolate the LV and HV nodes from the respective LV and HV supply lines;
    provide a backup voltage from the backup power source to the HV node;
    cause the bypass circuit to provide the backup voltage to the LV node; and
    cause the LV protection circuit to regulate the backup voltage at the LV node to maintain the low output voltage at the LV output port to within a predetermined operating range.

16. The data storage device as recited in claim 15, further comprising an LV isolation circuit coupled between the external power supply and the LV node, wherein the control circuitry is further configured to turn the LV isolation circuit to an off state to isolate the LV node from the LV supply line when the power fault is detected.

17. The data storage device as recited in claim 15, wherein the power control module further comprises an LV isolation circuit that is coupled between the external power supply and the LV input port, and wherein the control circuitry is further configured to turn the LV isolation circuit to an off state to isolate the LV node from the LV supply line when the power fault is detected.

18. The data storage device as recited in claim 17, wherein the LV isolation circuit is coupled between the LV input port and the LV node.

19. The data storage device as recited in claim 15, wherein the power control module further comprises an HV isolation circuit coupled between the HV input port and the HV node, wherein the control circuitry is further configured to cause the HV isolation circuit to isolate the HV node from the HV supply line when the power fault is detected.

20. The data storage device as recited in claim 19, wherein the HV isolation circuit provides switched back-gate biasing to provide switchable reverse or forward current protection.

21. The data storage device as recited in claim 15, wherein the control circuitry is further configured to cause the LV protection circuit to operate in an ohmic state to regulate the backup voltage at the LV node.

22. The data storage device as recited in claim 15, wherein the LV protection circuit comprises switched back gate biasing to provide switchable reverse or forward current protection.

23. The data storage device as recited in claim 15, wherein the bypass circuit provides switched back gate biasing to provide switchable reverse or forward current protection.

24. The data storage device as recited in claim 15, wherein the backup power source comprises a spindle motor.

25. The data storage device as recited in claim 24, wherein the power control module further comprises a spindle driver circuit coupled to the spindle motor, wherein the control circuitry is further configured to switch the spindle driver circuit to a hold-up mode to cause the spindle driver circuit to provide the backup voltage to the HV node.

26. The data storage device as recited in claim 15, wherein the control circuit is further configured to reduce thermal dissipation in LV protection circuit by controlling the LV protection circuit to cause the low output voltage at the LV output port to be higher than a mid-point of the predetermined operating range.

27. A method of operating a power control module, the power control module coupled to an external power supply and a backup power source and comprising:
    a low voltage (LV) input port for receiving a low supply voltage from the external power supply via an LV supply line;
    a high voltage (HV) input port for receiving a high supply voltage from the external power supply via an HV supply line, wherein the high supply voltage is higher than the low supply voltage;
    an LV output port for providing a low output voltage to a low voltage load;
    an HV output port for providing a high output voltage to a high voltage load;
    an LV node coupled to the LV input port;
    an HV node coupled to the HV input port;
    a bypass circuit coupled between the LV and HV nodes;
    an LV protection circuit coupled between the LV node and the LV output port; and
    control circuitry coupled to the bypass circuit and the LV protection circuit;
the method comprising:
    detecting a power fault on either the LV or the HV supply line;
    isolating the LV and HV nodes from the respective LV and HV supply lines;
    providing a backup voltage from the backup power source to the HV node;
    causing the bypass circuit to provide the backup voltage to the LV node; and
    causing the LV protection circuit to linearly regulate the backup voltage at the LV node to maintain the low output voltage at the LV output port to within a predetermined operating range.

28. The method as recited in claim 27, wherein the power control module further comprises an LV isolation circuit coupled between the external power supply and the LV node, further comprising turning the LV isolation circuit to an off state to isolate the LV node from the LV supply line when the power fault is detected.

29. The method as recited in claim 28, wherein the LV isolation circuit is coupled between the external power supply and the LV input port.

30. The method as recited in claim 28, wherein the LV isolation circuit is coupled between the LV input port and the LV node.

31. The method as recited in claim 27, wherein the power control module further comprises an HV isolation circuit coupled between the HV input port and the HV node, further comprising causing the HV isolation circuit to isolate the HV node from the HV supply line when the power fault is detected.

32. The method as recited in claim 31, wherein the HV isolation circuit provides switched back gate biasing to provide switchable reverse or forward current protection.

33. The method as recited in claim 27, comprising causing the LV protection circuit to operate in an ohmic state to linearly regulate the backup voltage at the LV node.

34. The method as recited in claim 27, wherein the LV protection circuit comprises switched back-gate biasing to provide switchable reverse or forward current protection.

35. The method as recited in claim 27, wherein the bypass circuit provides switched back gate biasing to provide switchable reverse or forward current protection.

36. The method as recited in claim 27, wherein the power control module further comprises a supply voltage monitor coupled to the LV input port and the HV input port and configured to detect the power fault on either the LV or the HV supply line and provide a power fault notification signal to the control circuitry.

37. The method as recited in claim 27, further comprising reducing thermal dissipation in the LV protection circuit by controlling the LV protection circuit to cause the low output voltage at the LV output port to be higher than a mid-point of the predetermined operating range.

* * * * *